United States Patent [19]

Bischoff et al.

[11] 4,437,922
[45] Mar. 20, 1984

[54] METHOD FOR TAILORING OXYGEN PRECIPITATE PARTICLE DENSITY AND DISTRIBUTION SILICON WAFERS

[75] Inventors: Bernard K. Bischoff, Putnam Valley; William J. Patrick, Fishkill; Thomas H. Strudwick, Wappingers Falls, all of N.Y.

[73] Assignee: International Business Machines Corporation, Armonk, N.Y.

[21] Appl. No.: 362,448

[22] Filed: Mar. 26, 1982

[51] Int. Cl.³ ............... H01L 21/322; H01L 21/324
[52] U.S. Cl. ......................... 156/603; 156/DIG. 73; 148/187; 148/188
[58] Field of Search ............... 156/601, 612, DIG. 64, 156/DIG. 73, 603; 148/1.5, 174, 175, 187, 188; 29/576 T

[56] References Cited

U.S. PATENT DOCUMENTS

| | | | |
|---|---|---|---|
| 3,615,873 | 10/1971 | Sluss, Jr. et al. | 148/1.5 |
| 3,723,053 | 3/1973 | Myers et al. | 148/1.5 |
| 3,929,443 | 12/1975 | Leuenberger et al. | 156/DIG. 73 |
| 4,144,099 | 3/1979 | Edmonds et al. | 148/175 |
| 4,193,783 | 3/1980 | Matsushita | 156/DIG. 73 |
| 4,314,595 | 2/1982 | Yamamoto et al. | 148/1.5 |
| 4,344,815 | 8/1982 | Cazarra et al. | 156/601 |

FOREIGN PATENT DOCUMENTS

| | | |
|---|---|---|
| 155569 | 6/1982 | German Democratic Rep. ... 29/576 T |
| 56-49532 | 5/1981 | Japan ................................ 29/576 T |
| 2080780 | 7/1981 | United Kingdom . |

OTHER PUBLICATIONS

L. E. Katz et al., High Oxygen Czochralski Silicon Crystal Growth Relationship to Epitaxial Stacking Faults, J. Electrochem. Soc., Solid-State Science and Technology, Jul. 1978, pp. 1151-1155.

IBM TDB "Producing Silicon Semiconductor Wafers with a High Internal Getter Density and a Surface Layer Free from Lattice Defects", by E. Biedermann, vol. 19, No. 4, Sep. 1976, p. 1295.

"Influence of Precipitate Size and Capillarity Effects on the Surface Denuded Zone in Thermally Processed Cz-Silicon Wafers", by R. W. Series et al., Semiconductor Silicon Electro-Chemical Society, 1981, pp. 304-312.

"Denuded Zone and Microdefect Formation in Czochralsky-Growth Silicon Wafers by Thermal Annealing", by K. Kugimiya et al., Semiconductor Silicon Electro-Chemical Society, 1981, pp. 294, 303.

"The Nucleation and Growth of Oxide Precipitates in Silicon", by H. F. Schaake et al., Semiconductor Silicon Electro-Chemical Society, 1981, pp. 273-281.

IBM TDB "Gettering By Oxygen Precipitation", by S. M. Hu et al., vol. 19, No. 12, May 1977, pp. 4618-4619.

*Primary Examiner*—David L. Lacey
*Attorney, Agent, or Firm*—Mitchell S. Bigel

[57] ABSTRACT

A wide precipitate-free-zone (PFZ) is formed at the surface of a semiconductor substrate and at the same time a high density of oxygen precipitate particles are produced beneath at the surface PFZ by a two step annealing process involving a first cycle of very rapidly heating the wafers to a first high temperature and a second cycle of very slowly heating the wafers to a second high temperature.

10 Claims, 5 Drawing Figures

METHOD FOR TAILORING OXYGEN PRECIPITATE PARTICLE DENSITY AND DISTRIBUTION SILICON WAFERS

DESCRIPTION

Technical Field

The present invention relates to a two step annealing process for tailoring oxygen precipitate particle density and distribution in Czochralski silicon wafers. The precipitation of oxygen has become an important parameter in describing the interaction between device processing yields and the starting silicon substrate.

Cross-Reference to Related Publications, Patent Applications and Patents

1. IBM TDB "Producing Silicon Semiconductor Wafers With A High-Internal Getter Density and A Surface Layer Free From Lattice Defects" by E. Biedermann, Vol. 19, No. 4, September 1976, page 1295;
2. "Influence of Precipitate Size and Capillarity Effects on the Surface Denuded Zone in Thermally Processed Cz-Silicon Wafers" by R. W. Series et al., "Semiconductor Silicon" Electro-Chemical Society, 1981, pages 304–312;
3. "Denuded Zone and Microdefect Formation in Czochralsky-Growth Silicon Wafers by Thermal Annealing" by K. Kugimiya et al., "Semiconductor Silicon" Electro-Chemical Society, 1981, pages 294–303;
4. "The Nucleation and Growth of Oxide Precipitates in Silicon" by H. F. Schaake et al., "Semiconductor Silicon" Electro-Chemical Society, 1981, pages 273–281;
5. U.S. Pat. No. 4,220,483 entitled "Method of Increasing The Gettering Effect in the Bulk of Semiconductor Bodies Utilizing A Preliminary Thermal Annealing Step" by V. G. Cazcarra, granted Sept. 2, 1980; and
6. IBM TDB "Gettering By Oxygen Precipitation" by S. M. Hu et al., Vol. 19, No. 12, May 1977, pages 4618–19.

Background Art

It has been known that Czochralski silicon wafers include interstitial oxygen which may precipitate and form microdefects during processing at elevated temperatures. Such microdefects may be either beneficial or detrimental to device performance.

To achieve beneficial results, the precipitation and associated defects must be confined to the bulk of the wafer leaving a region adjacent to the wafer surface free of microdefects. It is known that the oxygen precipitates formed in the bulk of silicon wafers work as internal gettering centers.

The concept of internally gettering detrimental contamination elements such as Fe, Ni, Cu and Au is described in IBM Technical Disclosure Bulletin, Vol. 19, No. 4, September 1976, page 1295. This article reports that defects in the silicon wafer are diffused internally by suitably controlled high temperature annealing, which makes it possible to obtain a surface layer free from defects while keeping a useful gettering effect in the bulk of the wafer. When these defects are located in the surface layer or close to the surface layer, they are known to cause pipe phenomenon or leakage currents.

"Influence of Precipitate Size and Capillarity Effects on the Surface Denuded Zone In Thermally Processed Cz-Silicon Wafers", by R. W. Series et al., published in "Semiconductor Silicon" Electro-Chemical Society, 1981, pages 304–312 reports that controlled denuded zones with bulk intrinsic gettering centers can be produced by a two stage process involving first a high temperature (e.g., 1150° C.) then a low temperature (e.g., 750° C.) heat treatment. However, if a straight 750° C. anneal is used, the times will be prohibitively long and the number of particles will be low.

"Denuded Zone and Microdefect Formation in Czochralsky-Growth Silicon Wafers by Thermal Annealing" by K. Kugimiya et al., published in "Semiconductor Silicon" Electro-Chemical Society, 1981, pages 294–303, reports a two-step anneal to obtain a defect-free zone at the surface and a precipitate particle density of approximately $10^{10}/cm^3$ beneath this layer. The high temperature cycle mentioned is four hours at 1100° C. to 1200° C. followed by a 650° C.–800° C. nucleation anneal for seventy hours and then a 1000° C.–1100° C. six hour anneal to grow the precipitates. The observed particle densities are too low and the process is too long.

"The Nucleation and Growth of Oxide Precipitates in Silicon" by H. F. Schaake et al., published in "Semiconductor Silicon" Electro-Chemical Society, 1981, pages 273–281 reports using a 1000° C. half an hour treatment to dissolve pre-existing nuclei. They then anneal forty-eight hours at 450° C. to nucleate new precipitates and then anneal 120 hours at 750° C. to grow them. The observed precipitate particle densities were $10^{12}/cm^3$. The process is too long to be practical for manufacturing.

U.S. Pat. No. 4,220,483 teaches that the gettering effect in the bulk of semiconductor bodies is increased by heating the bodies prior to device processing to a temperature of from 750°–900° C. for from 1–8 hours in order to generate oxygen precipitates in the form of clusters. Our experimentation in this temperature range indicates that the particle density will be too low for effective strengthening of the wafer.

IBM Technical Disclosure Bulletin, Vol. 19, No. 12, May 1977, pp. 4618–4619 reports that heating semiconductor wafers at temperatures of about 1000° C. for 4 to 6 hours in a dry oxygen or inert atmosphere causes out-diffusion of oxygen from the semiconductor surface so that a defect-free surface layer is formed.

Control of oxygen precipitation by annealing silicon wafers has been extensively studied. To date, however, no practical sequence of anneal cycles has been discovered which will remove pre-existing oxygen clusters, out-diffuse oxygen from the wafer surface and thus cause uniform, dense precipitation beneath this surface layer to allow impurity gettering by precipitation-induced defects.

DISCLOSURE OF INVENTION

It is an object of the present invention to provide a method for forming a wide precipitate free zone at the surface of a semiconductor substrate with a high density of precipitate particles underneath.

It is another object of the present invention to provide a method for producing the high particle density and wide precipitate free zone in a relatively short time.

In accordance with the present invention, a wide precipitate-free-zone (PFZ) is formed at the surface of a semiconductor substrate and at the same time a high density of precipitate particles are produced beneath the surface PFZ by the two step annealing process involving first a high temperature cycle and then a low temperature cycle.

The purpose of the high temperature cycle is twofold, that is, to reduce the number of pre-existing oxygen clusters by dissolution and to out-diffuse the oxygen as the first step in the formation of precipitate-free zone. The high temperature cycle can be carried out at any temperature above 1000° C., the upper limit being set by the melting point of the silicon of about 1415° C. Practically, this temperature should be chosen to be as high as possible without introducing plastic deformation of the wafers. It was found experimentally that this can be realized for 82.5 mm wafers around 1100° C. A further consideration is the softening of the $SiO_2$ glassware above about 1150° C. It is important that the wafers are rapidly heated to the high temperature, that is, at a rate in excess of 10° C./minute. Preferably, the wafers are brought to the high temperature by rapid insertion into the furnace tube which is already at 1100° C. The wafers are held at the high temperature for about four hours and ramped back down to a lower temperature such as 800° C. at which point they are removed from the furnace.

The width of the PFZ depends on the oxygen profile formed in this high temperature out-diffusion step. It was found that four hours at 1100° C. is appropriate for obtaining PFZ widths in excess of 15 μm.

It is recognized that dissolution of the pre-existing precipitates and clusters is insured by the rapid heat-up at a rate in excess of 10° C./minute. When lower heat-up rate is used, precipitation of oxygen begins, which is detrimental to the first purpose of the high temperature cycle, that is, to reduce the number of pre-existing oxygen clusters by dissolution.

The process proceeds to the low temperature cycle. The purpose of this portion of the process is to precipitate the oxygen and form a high density of very small precipitate particles. These small particles, however, must be large enough to survive the initial device hot processes. The strategy followed is to nucleate the precipitates at a low temperature and then grow them to such a size as to permit survival of a subsequent heat treatment such as 925° C., two hour anneal for oxidation step. The wafers are annealed at a low temperature of the range of 400° C. to 500° C., preferably at 450° C. for about four hours. This annealing yields about $1 \times 10^{15}$ donor clusters. It is assumed that each cluster size has a temperature range in which it is stable. If this temperature range is exceeded, the cluster will dissolve.

After the low temperature anneal, the wafers are very slowly heated to a second high temperature in the range of 750° C. to 1000° C., at a rate lower than 2° C./minute. If higher ramp rate is used, it will result in much lower precipitate particle density. The wafers are annealed at the second high temperature so that the precipitated particles nucleated during the low temperature anneal grow to a size which will insure their survival in subsequent device processing. The particle growth is a diffusion controlled mechanism and the growth temperature must be high enough to give adequate mobility to the oxygen atoms. Since the wafers have to be heated very slowly, it is practical to heat up the wafers to a temperature in the range from 750° C. to 850° C. at a very low rate and after a pause at this temperature the wafers may be heated up to a temperature of from 900° C. to 1000° C. at a higher rate, which is the temperature of the first hot process in the device line, to insure that the particles will not be dissolved in the subsequent process.

BEST MODE FOR CARRYING OUT THE INVENTION

Semiconductor wafers of 82.5 mm in diameter are rapidly heated up to 1100° C. by rapid insertion of the same into the furnace tube which is already at 1100° C. Recovery of the furnace temperature occurs within two minutes of insertion of the wafers. In the case of the 100 mm diameter wafers, it is preferable to heat them up by rapid insertion into the furnace at 1000° C. and immediately ramping to 1100° C. at 10° C./minute to avoid the problems of plastic deformation which causes both peripheral slip and center slip.

Figure 1:
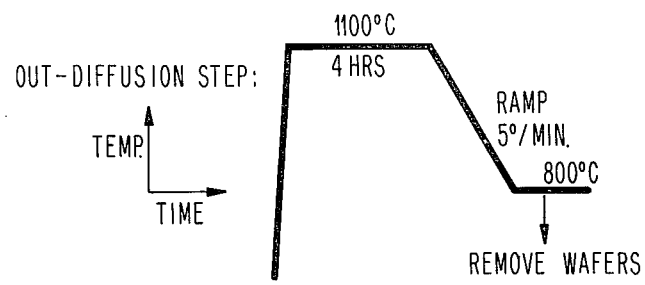
FIG. 1 is the temperature-time diagram of the high temperature cycle in one example of the invention.

The wafers are held at 1100° C. for four hours for oxygen outdiffusion and ramped back to 800° C. at 5° C./minute at which point they are removed from the furnace. FIG. 1 shows this high temperature cycle.

The process now proceeds to the low temperature cycle. After being annealed at 450° C. for four hours, the wafers are slowly heated to 800° C. at a rate of 0.84° C./minute, for total heat up time of six hours and fifty six minutes and fifty seconds and kept at this temperature for two hours. So as to ensure that the precipitate particles survive in subsequent device processing, the wafers are annealed at 925° C. for two hours, which is the temperature of the first hot process in the device manufacturing line. The wafers are now ramped down to 800° C. and removed from the furnace.

Figure 2:
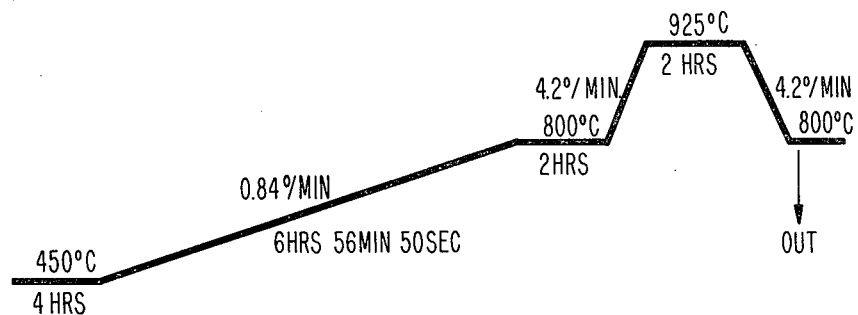
FIG. 2 is the temperature-time diagram of the low temperature cycle in one example of the invention.

This low temperature cycle is illustrated in FIG. 2. The total cycle time of the low temperature cycle is sixteen hours.

Figure 3:
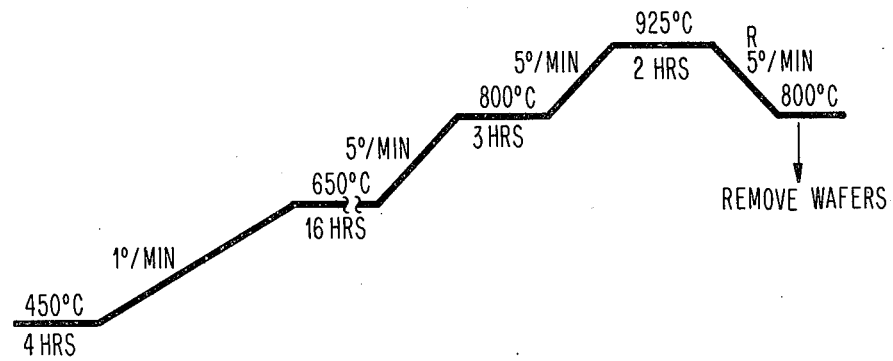
FIG. 3 is the temperature-time diagram of the low temperature cycle in another example of the invention.
Figure 4:
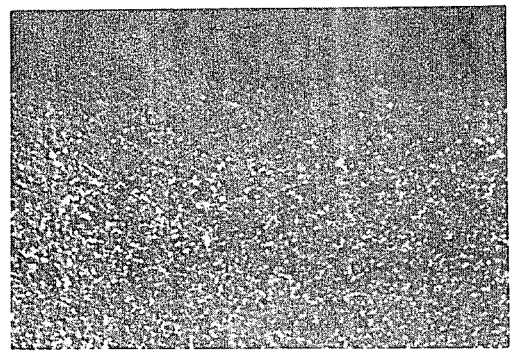
FIG. 4 is the microscopic photograph of the cross section of a wafer which was processed with the method of the present invention.
Figure 5:
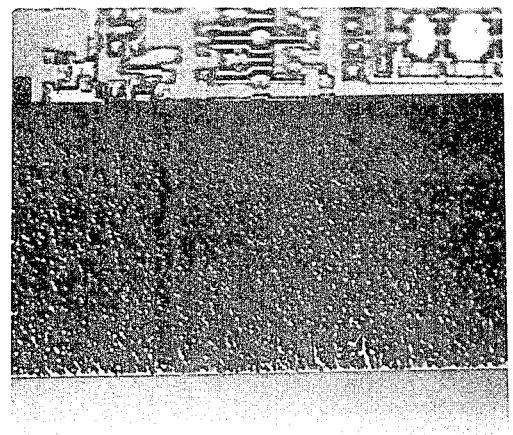
FIG. 5 is the microscopic photograph of the cross section of a wafer which was processed with a conventional process.

Another mode of the low temperature cycle is illustrated in FIG. 3. Pieces were cleaved from the wafers and they were beveled at 5° on a ground glass plate using silica gel polishing slurry which is widely used for polishing silicon wafers. The beveled samples were etched for two minutes to reveal the oxygen precipitates. It was found by optical microscopy that the precipitate free zone was in excess of 16 μm and the precipitate particle density was larger than $10^{12}/cm^3$. The microscopic photograph of the cross section of the wafer is shown in FIG. 4. In contrast, a similar microscopic photograph of a beveled cross section of a wafer which was processed with a conventional semiconductor device manufacturing process is shown in FIG. 5. The precipitate free zone at the surface of the wafer is shallow and the oxygen precipitates are located close to the surface layer, which may cause pipe phenomenon or leakage currents thereby resulting in low yield of large scale integrated circuit devices.

While the invention has been particularly shown and described with reference to the embodiments thereof, it will be understood by those skilled in the art that the foregoing and other changes in form and detail may be made therein without departing from the spirit and scope of the invention.

We claim:

1. A method for tailoring oxygen precipitate particle density and distribution in a silicon wafer, comprising the steps of:

heating the silicon wafer to a first high temperature at a rate higher than 10° C./minute, said first high temperature being sufficiently high to reduce the number of pre-existing oxygen clusters, keeping said wafer at said first high temperature for a period sufficient to allow outdiffusion of oxygen, allowing said wafer to cool, annealing said wafer at a low temperature, said low temperature being sufficiently low to nucleate precipitated oxygen, and heating said wafer to a second high temperature at a rate lower than 2° C./minute, said second high temperature being sufficiently high to grow the precipitated oxygen nucleated at said low temperature to a size which ensures survival of the precipitated oxygen in subsequent processing.

2. The method of claim 1 wherein said low temperature is between 400° C. and 500° C.

3. The method of claim 2 wherein said second high temperature is between 750° C. and 1000° C.

4. The method of claim 3 wherein said first high temperature is between 1000° C. and 1400° C.

5. The method of claim 4 wherein said wafer is heated up to said first high temperature by inserting said wafer into a furnace which is already substantially at said first high temperature.

6. The method of claim 5 wherein said wafer is kept at said first high temperature for approximately four hours.

7. The method of claim 5 wherein the wafer cooling step comprises the steps of:

ramping down from said first high temperature to approximately 800° C. and removing said wafer from the furnace.

8. A method for tailoring oxygen precipitate particle density and distribution in a silicon wafer, comprising the steps of:

heating the silicon wafer to a first high temperature at a rate higher than 10° C./minute, said first high temperature being sufficiently high to reduce the number of pre-existing oxygen clusters, keeping said wafer at said first high temperature for a period sufficient to allow outdiffusion of oxygen, allowing said wafer to cool, annealing said wafer at a low temperature, said low temperature being sufficiently low to nucleate precipitated oxygen, heating said wafer to a temperature in the range of 750° C. to 850° C. at a rate lower than 2° C./minute, and heating said wafer to a temperature in the range of 900° C. to 1000° C.

9. A method for tailoring oxygen precipitate particle density and distribution in a silicon wafer, comprising the steps of:

heating the silicon wafer to a first high temperature at a rate higher than 10° C./minute, said first high temperature being sufficiently high to reduce the number of pre-existing oxygen clusters, keeping said wafer at said first high temperature for a period sufficient to allow outdiffusion of oxygen, allowing said wafer to cool, annealing said wafer at a low temperature, said low temperature being sufficiently low to nucleate precipitated oxygen, heating said wafer to a second high temperature of approximately 650° C. at a rate lower than 2° C./minute, keeping said wafer at said second high temperature for a time sufficient to grow precipitate particles, and heating said wafers to a third high temperature in the range of 750° C. to 850° C. at a higher rate.

10. The method of claim 9 wherein the time sufficient to grow precipitate particles is about sixteen hours.

* * * * *